US010096531B2

(12) United States Patent
Jaeger et al.

(10) Patent No.: US 10,096,531 B2
(45) Date of Patent: Oct. 9, 2018

(54) SEMICONDUCTOR DEVICE WITH SENSOR POTENTIAL IN THE ACTIVE REGION

(71) Applicant: Infineon Technologies AG, Neubiberg (DE)

(72) Inventors: Christian Jaeger, Munich (DE); Johannes Georg Laven, Taufkirchen (DE); Frank Dieter Pfirsch, Munich (DE); Alexander Philippou, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/861,569

(22) Filed: Sep. 22, 2015

(65) Prior Publication Data

US 2016/0099188 A1 Apr. 7, 2016

(30) Foreign Application Priority Data

Oct. 2, 2014 (DE) .................. 10 2014 220 056

(51) Int. Cl.
*H01L 21/66* (2006.01)
*H01L 29/06* (2006.01)
(Continued)

(52) U.S. Cl.
CPC .......... *H01L 22/32* (2013.01); *H01L 29/0653* (2013.01); *H01L 29/407* (2013.01);
(Continued)

(58) Field of Classification Search
CPC ................................. H01L 29/7826
See application file for complete search history.

(56) References Cited

U.S. PATENT DOCUMENTS

2005/0194635 A1  9/2005  Pfirsch
2007/0173021 A1* 7/2007  Kocon .................. H01L 29/407
                                                           438/270
(Continued)

FOREIGN PATENT DOCUMENTS

DE       10123818 B4    9/2006
JP       H11266016 A    9/1999
(Continued)

*Primary Examiner* — Tom Thomas
*Assistant Examiner* — Steven B Gauthier
(74) *Attorney, Agent, or Firm* — Murphy, Bilak & Homiller, PLLC

(57) ABSTRACT

A semiconductor device includes semiconductor body region and a surface region, the semiconductor body region including a first conductivity type first semiconductor region type and a second conductivity type second semiconductor region. The semiconductor device further includes: a first load contact structure included in the surface region and arranged for feeding a load current into the semiconductor body region; a first trench extending into the semiconductor body region and having a sensor electrode and a first dielectric, the first dielectric electrically insulating the sensor electrode from the second semiconductor region; an electrically conductive path electrically connecting the sensor electrode to the first semiconductor region; a first semiconductor path, wherein the first semiconductor region is electrically coupled to the first load contact structure by at least the first semiconductor path; a sensor contact structure included in the surface region and arranged for receiving an electrical potential of the sensor electrode.

20 Claims, 7 Drawing Sheets

(51) Int. Cl.
*H01L 29/423* (2006.01)
*H01L 29/78* (2006.01)
*H01L 29/40* (2006.01)

(52) U.S. Cl.
CPC ...... *H01L 29/4236* (2013.01); *H01L 29/7813* (2013.01); *H01L 29/7815* (2013.01); *H01L 29/7827* (2013.01)

(56) References Cited

U.S. PATENT DOCUMENTS

| | | | |
|---|---|---|---|
| 2012/0211831 A1* | 8/2012 | Hsieh | H01L 21/823481 257/334 |
| 2013/0181723 A1 | 7/2013 | Mauder et al. | |
| 2014/0217495 A1 | 8/2014 | Wutte et al. | |

FOREIGN PATENT DOCUMENTS

| JP | H11274477 A | 10/1999 |
|---|---|---|
| JP | 2005277122 A | 10/2005 |
| JP | 2009081168 A | 4/2009 |
| JP | 2009188335 A | 8/2009 |
| JP | 2011049272 A | 3/2011 |
| JP | 2013211374 A | 10/2013 |

* cited by examiner

SEMICONDUCTOR DEVICE WITH SENSOR POTENTIAL IN THE ACTIVE REGION

PRIORITY CLAIM

This application claims priority to German Patent Application No. 10 2014 220 056.3 filed on 2 Oct. 2014, the content of said application incorporated herein by reference in its entirety.

TECHNICAL FIELD

This specification refers to embodiments of semiconductor devices, semiconductor components and semiconductor apparatuses, for example to embodiments of IGBTs, MOSFETs, diodes and the like. In particular, this specification refers to embodiments of semiconductor devices, semiconductor components and semiconductor apparatuses having means for allowing an integrated measurement of a signal of a semiconductor body region.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs) and Metal Oxide Semiconductor Field Effect Transistors (MOSFETs) and diodes have been used for various applications including, but not limited to switches in power supplies and power converters.

Occasionally, a semiconductor device is equipped with means for carrying out a protective function, such as a short circuit turn-off function. To this end, the semiconductor device may be electrically coupled to a control circuit that controls operation of the semiconductor device in dependence of a semiconductor device temperature and/or in dependence of a semiconductor device load current that flows through the semiconductor device. For example, if the semiconductor device temperature and/or the semiconductor device load current exceeds a respective threshold value, the control circuit may react by turning off the semiconductor device, which causes the load current to be reduced to approximately zero.

In order to determine a load current, it is known that some of the emitter current of an IGBT can be directed separately via an auxiliary connection. In terms of magnitude, this current can be proportional to the main emitter current, i.e., the load current. A measurement signal can be evaluated by means of an external control circuit comprising, for example, a low-impedance resistance, and if applicable, subsequent circuit amplification and isolated signal transmission. For example, the voltage-drop across the low-impedance resistance is proportional to the main emitter current.

A temperature measurement may be implemented by means of a pn-junction (diode), the forward voltage-drop of which is dependent on the temperature and can be evaluated by using an external control circuit.

For determining a semiconductor device temperature and/or a semiconductor device load current, it is sometimes desirable to measure an electrical potential of a part of a semiconductor body region of the semiconductor device.

It is known to use a separated region of the semiconductor body region of the semiconductor device for determining said electrical potential, wherein the separated region is usually located within an edge area of the semiconductor device and, due to this location, not available for conducting the load current. Using such separated region for measurement purposes leads, therefore, to a loss of the area of this separated region of the device that otherwise would be available for conducting the load current, i.e., to loss of active semiconductor area. Further, since the separated region is separated from the remaining semiconductor body region that is used for load operation of the semiconductor device, signals generated within the separated region are not exactly indicative for the state of the semiconductor body region that is used for load operation of the device. Such possible inaccuracy of the measurement has to be taken into account by the control circuit, which may cause the control circuit to be rather complex.

According to DE 101 23 818 B4, a control circuit implements the protection function and is controlled by an electrically floating region that is located in a semiconductor body region of the semiconductor device. Further, the semiconductor device known from that publication contains a MOS transistor whose gate electrode is electrically connected to the electrically floating region or consists of the electrically floating region. For example, for implementing a short-circuit power cutoff, an electrical potential of a floating p-region of the semiconductor body region is used.

SUMMARY

According to an embodiment, a semiconductor device is provided. The semiconductor device includes a semiconductor body region and a surface region, wherein the semiconductor body region includes a first semiconductor region having charge carriers of a first conductivity type and a second semiconductor region having charge carriers of a second conductivity type. The semiconductor device further includes a first load contact structure included in the surface region and arranged for feeding a load current into the semiconductor body region. The semiconductor device also includes a first trench extending into the semiconductor body region and having a sensor electrode and a first dielectric. The first dielectric electrically insulates the sensor electrode from the second semiconductor region. The semiconductor device includes an electrically conductive path that electrically connects the sensor electrode to the first semiconductor region. The first semiconductor region is electrically coupled to the first load contact structure by means of at least a first semiconductor path of the semiconductor device. The semiconductor device further includes a sensor contact structure included in the surface region and arranged for receiving an electrical potential of the sensor electrode.

According to a further embodiment, a further semiconductor device is provided. The further semiconductor device includes a semiconductor body region and a surface region, the semiconductor body region including a first semiconductor region having charge carriers of a first conductivity type and including a second semiconductor region having charge carriers of a second conductivity type. The further semiconductor device additionally includes a first load contact structure included in the surface region and arranged for feeding a load current into the semiconductor body region. Further, a first trench extends into the semiconductor body region and includes a sensor electrode and a first dielectric, the first dielectric electrically insulating the sensor electrode from the second semiconductor region. An electrically conductive path electrically connects the sensor electrode to the first semiconductor region. The sensor electrode is electrically coupled to the first load contact structure by means of at least a first semiconductor path. The further semiconductor device further includes a sensor contact structure included in the surface region and arranged for receiving an electrical potential of the sensor electrode.

According to yet a further embodiment, a semiconductor component is provided. The semiconductor component includes a semiconductor body region and a surface region, wherein the semiconductor body region includes a first semiconductor region having charge carriers of the first conductivity type and a second semiconductor region comprising charge carriers of a second conductivity type. The semiconductor component includes a first load contact structure included in the surface region and arranged for feeding a load current into the semiconductor body region. The semiconductor component also includes a first trench extending into the semiconductor body region and comprising a sensor electrode and a first dielectric. The first dielectric electrically insulates the sensor electrode from the second semiconductor region. The semiconductor component further includes an electrically conductive path that electrically connects the sensor electrode to the first semiconductor region. The first semiconductor region is electrically coupled to the first load contact structure by means of at least a first semiconductor path. The semiconductor component further includes a sensor contact structure included in the surface region and arranged for receiving an electrical potential of the sensor electrode. Further, the semiconductor component corn includes prises at least one second trench extending into the semiconductor body region, wherein the at least one second trench includes a control electrode and a second dielectric, and wherein the control electrode is arranged for controlling the load current in dependence of a control signal, and wherein the second dielectric electrically insulates the control electrode from the semiconductor body region.

According to another embodiment, a semiconductor apparatus is provided. The semiconductor apparatus includes at least one semiconductor component and a control circuit. The at least one semiconductor component includes a semiconductor body region and a surface region, wherein the semiconductor body region includes a first semiconductor region having charge carriers of the first conductivity type and a second semiconductor region comprising charge carriers of a second conductivity type. The semiconductor component includes a first load contact structure included in the surface region and arranged for feeding a load current into the semiconductor body region. The semiconductor component also includes a first trench extending into the semiconductor body region and comprising a sensor electrode and a first dielectric. The first dielectric electrically insulates the sensor electrode from the second semiconductor region. The semiconductor component further includes an electrically conductive path that electrically connects the sensor electrode to the first semiconductor region. The first semiconductor region is electrically coupled to the first load contact structure by means of at least a first semiconductor path. The semiconductor component further includes a sensor contact structure included in the surface region and arranged for receiving an electrical potential of the sensor electrode. Further, the semiconductor component includes at least one second trench extending into the semiconductor body region, wherein the at least one second trench includes a control electrode and a second dielectric, and wherein the control electrode is arranged for controlling the load current in dependence of a control signal, and wherein the second dielectric electrically insulates the control electrode from the semiconductor body region. The control circuit is arranged to control the load current in dependence of the electrical potential of the sensor electrode.

In each of the semiconductor devices, the semiconductor component and the semiconductor apparatus, the first semiconductor region includes an electrically floating region of the semiconductor body region.

Since the sensor electrode is electrically connected to the first semiconductor region by means of the electrically conductive path, the electrical potential of the sensor electrode is substantially identical to an electrical potential of the first semiconductor region. The electrical potential of the sensor electrode is received by the sensor contact structure. According to an embodiment, the sensor contact structure is arranged to be electrically coupled to the control circuit. Thus, the control circuit may determine the electrical potential of the sensor electrode, i.e., the electrical potential of the first semiconductor region. The control circuit may control operation of the semiconductor device or, respectively, the semiconductor component or the semiconductor apparatus in dependence of the determined electrical potential of the first semiconductor region.

Thereby, a structure can be established which allows deducting signals from a central active semiconductor region of the semiconductor body region to the sensor contact structure without substantially reducing the total amount of the active semiconductor area available.

Features of further embodiments are defined in the dependent claims.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
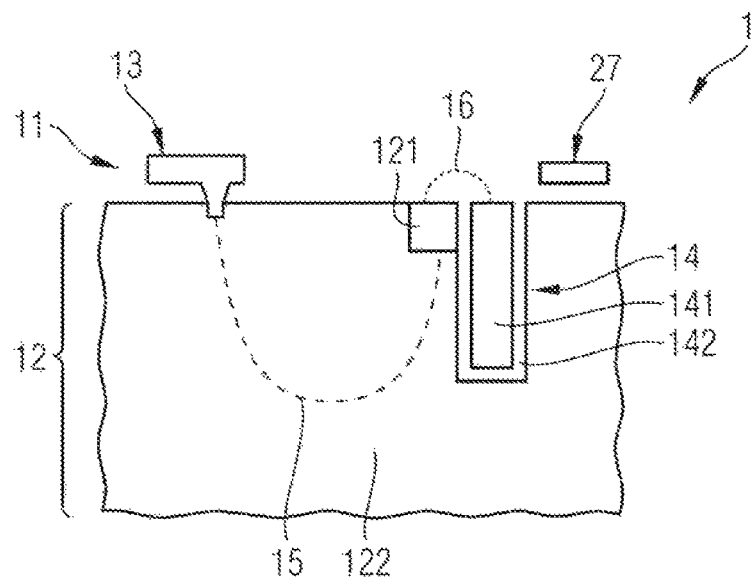
FIG. 1 schematically illustrates a section of a vertical cross-section of a semiconductor device, according to one or more embodiments.

In the following detailed description, reference is made to the accompanying drawings which form a part hereof and in which are shown by way of illustration specific embodiments in which the invention may be practiced.

In this regard, directional terminology, such as "top," "bottom," "below," "front," "behind," "back," "leading," "trailing," etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor body region.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

Specific embodiments described in this specification pertain to, without being limited thereto, monolithically integrated semiconductor devices having an IGBT or MOSFET structure, e.g., to power semiconductor devices, such as stripe cell configuration IGBTs.

The term "power semiconductor device" as used in this specification intends to describe a semiconductor device on a single chip with high voltage blocking and switching and/or high current carrying and switching capabilities. In other words, power semiconductor devices are intended for high current, typically in the Ampere range, e.g., up to several hundred Ampere, and/or high voltages, typically above 200 V, more typically 600 V and above.

In the context of the present specification, the terms "in ohmic contact", "in electric contact," "in contact," "in ohmic connection," and "electrically connected" intend to describe that there is a low ohmic electric connection or low ohmic current path between two regions, sections, portions or parts of a semiconductor device or between different terminals of one or more devices or between a terminal or a metallization or an electrode and a portion or part of a semiconductor device. The same applies to embodiments of a semiconductor component and a semiconductor apparatus presented below.

FIG. 1 schematically illustrates an embodiment of a semiconductor device 1 in a section of a vertical cross-section. The semiconductor device includes a semiconductor body region 12 and a surface region 11. The semiconductor body region 12 includes a first semiconductor region 121 comprising charge carriers of the first conductivity type and a second semiconductor region 122 comprising charge carriers of the second conductivity type. According to an embodiment, the first semiconductor region 121 is a semiconductor region of the first conductivity type and/or the second semiconductor region 122 is a semiconductor region of the second conductivity type.

For example, the first semiconductor region 121 comprises a p-well or, respectively, is formed by a p-well. The second semiconductor region 122 can comprise a drift region of the semiconductor device 1, for example an n-drift region.

The surface region 11 includes a first load contact structure 13. The first load contact structure 13 is arranged for feeding a load current into the semiconductor body region 12. For example, the load current is provided by a voltage source (not shown) that is electrically coupled to the first load contact structure 13. The load current may be conducted through the semiconductor device 1 by means of the second semiconductor region 122.

The semiconductor device 1 further comprises a first trench that extends into the semiconductor body region 12. The first trench 14 comprises a sensor electrode 141 and a first dielectric 142. The first dielectric 142 electrically insulates the sensor electrode 141 from the second semiconductor region 122. For example, the first dielectric 142 separates the sensor electrode 141 from the second semiconductor region 122. An electrically conductive path 16 electrically connects the sensor electrode 141 to the first semiconductor region 121.

In FIG. 1, the electrically conductive path 16 is only illustrated schematically by means of a dotted line. Exemplary embodiments of the electrically conductive path 16 will be described with reference to other figures.

Due to the electrically conductive path 16, the electrical potential of the first semiconductor region 121 is transferred to the sensor electrode 141. Therefore, the electrical potential of the sensor electrode 141 is substantially identical to the electrical potential of the first semiconductor region 121.

Further, the first semiconductor region 121 is electrically coupled to the first load contact structure 13 by means of at least a first semiconductor path 15. In accordance with the embodiment illustrated in FIG. 1, the first semiconductor path 15 traverses through the second semiconductor region 122. Since the second semiconductor region 122 may conduct the load current at least partially, the electrical potential of the first semiconductor region 121 and, therefore, the electrical potential of the sensor electrode 141 depend on both the load current and a voltage-drop across the second semiconductor region 122.

In the surface region 11, there is further included a sensor contact structure 27. In FIG. 1, this sensor contact structure 27 is also only schematically illustrated. Specific examples for implementing the sensor contact structure 27 are explained with reference to other figures. In any case, the sensor contact structure 27 is arranged for receiving the electrical potential of the sensor electrode 141. For example, the sensor contact structure 27 may be contacted by a control circuit (not shown in FIG. 1) which may be adapted for controlling the semiconductor device 1, for example for controlling the load current, in dependence of the electrical potential of the sensor electrode 141. By means of the sensor electrode 141, the electrical potential of the first semiconductor region 121 is transferred to a position of the sensor contact structure 27. Thus, the electrical potential of the first semiconductor region 121 can be provided to the control circuit that is electrically coupled to the sensor contact structure 27, i.e., to a location where the electrical potential of the first semiconductor region 121 has to be determined in order to carry out the protective function.

The first semiconductor region 121 may be an electrically floating region of the semiconductor device 1. For example, the first semiconductor region 121 is not electrically connected to a part of the semiconductor device 1 that exhibits a fixed electrical potential or, respectively, a definite electrical potential. In other words, the electrical potential of the first semiconductor region 121 can be an electrical potential of an active region of the semiconductor body region 12 and is provided to the sensor contact structure 27 that is located within the surface region 11. In an embodiment, the first semiconductor region 121 is electrically coupled to the first load contact structure 13 only by means of the first semiconductor path 15.

At this point, it shall be noted that the surface region 11 cannot only be located on top of the semiconductor body region 12, as indicated by FIG. 1, but could also extend into other regions, for example below the semiconductor body region 12 or in side regions left, right, in front of and/or behind the semiconductor body region 12.

As further illustrated in FIG. 1, the first trench 14 comprising the sensor electrode 141 may be a trench of the semiconductor device 1 that is not used for other purposes. For example, with regard to a stripe cell configuration IGBT, a plurality of trenches are usually employed, such as trenches comprising field electrodes and trenches comprising gate electrodes. In accordance with an embodiment, at least one of the electrodes of such trenches is not used as control electrode or as field electrode, but as the sensor electrode 141 as indicated in FIG. 1.

The semiconductor path 15 is included within the semiconductor body region 12 and traverses through parts of the second semiconductor region 122. A transition between the first semiconductor region 121 and the second semiconductor region 122 forms a first pn-junction. Since the second semiconductor region 122 conducts at least part of the load current, the voltage-drop across the semiconductor path 15 depends on the load current. The first semiconductor path 15 can comprise a section into which a high-field region of the semiconductor body region 12 may extend, e.g., during a short-circuit operation of the semiconductor device 1. Therefore, the electrical potential of the first semiconductor region 121 and, thus, the electrical potential of the sensor electrode 141, depend on both the load current and the voltage-drop across the second semiconductor region 122.

The first semiconductor region 121 may be arranged along the entire lateral length of the first trench 14 (i.e., the length extending in a direction substantially parallel to the normal direction of the vertical cross-section) or, alternatively, only along one or more parts of the first trench 14. For example, said one or more parts may be separated from each other by means of further dielectric regions (not shown).

The semiconductor device 1 may comprise a second load contact structure (not shown in FIG. 1) that is arranged for coupling the load current out of the semiconductor body region 12.

Figure 2:
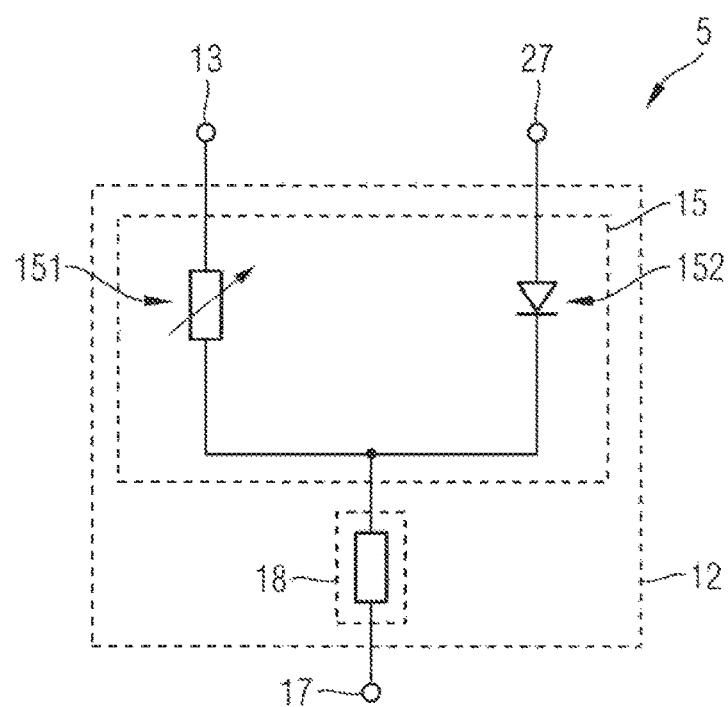
FIG. 2 schematically illustrates an equivalent circuit of a semiconductor device, according to one or more embodiments.

FIG. 2 schematically illustrates an equivalent circuit 5 of the semiconductor device 1 for better understanding the proposed measurement principle. The load current is coupled into the semiconductor body region 12 by means of the first load contact structure 13. For example, the first load contact structure 13 comprises a source/emitter contact of the semiconductor device 1. In order to couple the load current out of the semiconductor body region 12, the semiconductor device 1 may comprise a second load contact structure 17 (not shown in FIG. 1). For example, the second load contact structure 17 comprises a drain/collector contact of the semiconductor device 1.

As the sensor contact structure 27 receives the electrical potential of the sensor electrode 141, which is substantially identical to the electrical potential of the first semiconductor region 121, the sensor contact structure 27 may be considered to be electrically coupled to the first load contact structure 13 by means of at least the first semiconductor path 15, as illustrated in FIG. 2. Within the equivalent circuit 5, the first semiconductor path 15 can be divided into a first part 151 and a second part 152.

The first part 151 of the first semiconductor path 15 is formed by a part of the second semiconductor region 122. The voltage-drop across the first part 151 depends on the load current and is represented by a variable resistor. Further, the first part 151 may exhibit a variable resistance in case of an expanding or receding space charge region within the second semiconductor region 122.

The second part 152 of the first semiconductor path 15 corresponds to said first pn-junction that is formed by a transition between the first semiconductor region 121 and the second semiconductor region 122 and is, therefore, represented by a diode.

A second semiconductor path 18 included in the semiconductor body region 12 is electrically coupled to the second load contact structure 17, such that the second load contact structure 17 can couple the load current out of the semiconductor body region 12. The second semiconductor path 18 may comprise at least parts of the second semiconductor region 122.

As already elaborated with respect to FIG. 1, the sensor contact structure 27 may be coupled to a control circuit. The control circuit may thus determine the electrical potential of the first semiconductor region 121 and, therefore, an electrical potential of an active region of the semiconductor body region 12.

Figure 3:
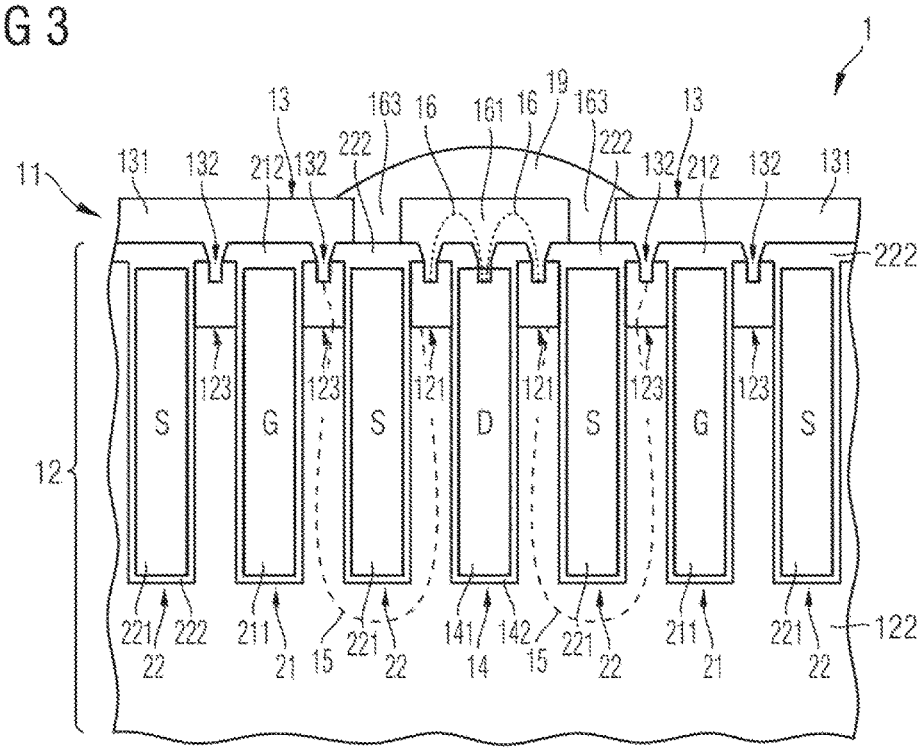
FIG. 3 schematically illustrates a section of a vertical cross-section of a, semiconductor device according to one or more embodiments.

FIG. 3 schematically illustrates a further embodiment of the semiconductor device 1 in a section of a vertical cross-section. In accordance with this embodiment, the electrically conductive path 16 is included in the surface region 11 and comprises an island 161, wherein the island 161 electrically connects the sensor electrode 141 to the first semiconductor region 121. The island 161 is electrically insulated from the first load contact structure 13.

Further, the first dielectric 142 of the first trench 14 electrically insulates the sensor electrode 141 also from the first semiconductor region 121. For example, the first dielectric 142 separates the sensor electrode 141 also from the first semiconductor region 121. In the embodiment according to FIG. 3, the first semiconductor region 121 comprises two wells adjacent to the first trench 14. In the following, these two wells are referred to as first semiconductor regions 121. In an embodiment, the first semiconductor regions 121 are each electrically coupled to the first load contact structure 13 only by means of a respective first semiconductor path 15.

The semiconductor device 1 shown in FIG. 3 further comprises a plurality of second trenches 21, wherein each second trench 21 extends into the semiconductor body region 12 and comprises a control electrode 211 and a second dielectric 212. Each control electrode 211 is arranged for controlling the load current in dependence of a control signal that is provided to the semiconductor device 1. Each control electrode 211 is insulated from the semiconductor body region 12 by the second dielectric 212. For example, the control electrodes 211 comprise gate electrodes of the semiconductor device 1.

The semiconductor device 1 illustrated in FIG. 3 further comprises a plurality of third trenches 22, wherein each third trench also extends into the semiconductor body region 12 and comprises a field electrode 221 and a third dielectric 222, wherein the field electrode 221 is electrically connected to the first load contact structure 13. Each field electrode 221 is electrically insulated from the semiconductor body region 12 by the third dielectric 222.

For more easily differentiating the trenches 14, 21 and 22 from each other, the first trench is labelled with "D" (detection), the second trenches are labelled with "G" (gate) and the third trenches are labelled with "S" (source).

The semiconductor device 1 shown in FIG. 3 further includes third semiconductor regions 123 that comprise charge carriers of the first conductivity type. As indicated in FIG. 3, these third semiconductor regions 123 may be formed by a plurality of respective wells that are in electrical contact with first load contacts 131 of the first load contact structure 13. According to an embodiment, the third semiconductor regions 123 are semiconductor regions of the first conductivity type.

As illustrated in FIG. 3, each first load contact 131 may exhibit a number of first load contact grooves 132 that are in contact with a respective third semiconductor region 123.

An encapsulation 19 arranged between the island 161 and the first load contacts 131 ensures an electrical insulation between the island 161 and the first contacts 131. For example, the island 161 comprises a metal layer that is electrically insulated from the load contact structure 13 and that is electrically connected to both the first semiconductor regions 121 and the sensor electrode 141 in accordance with a conventional electrical contact mechanism.

Summarizing, in accordance with the embodiment illustrated in FIG. 3, the electrical potential of the first regions 121, i.e., the electrical potential of electrically floating mesas between the first trench 14 and the neighboring third trenches 22, is electrically coupled into the sensor electrode 141. By means of the sensor electrode 141, the electrical potential is "transferred" to the sensor contact structure 27 (not shown in FIG. 3).

For example, the semiconductor device 1 comprises a plurality of such islands 161, which may be distributed in the surface region 11 with respect to the positions of bond feet (not shown in FIG. 3) for contacting the first load contact structure 13.

Figure 4:
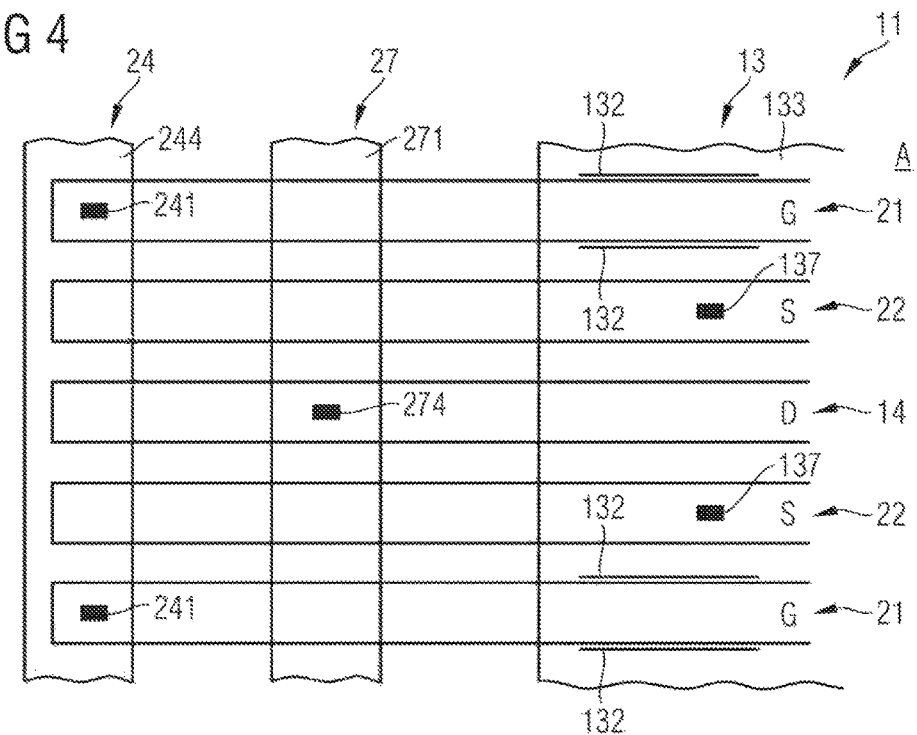
FIG. 4 schematically illustrates a section of a horizontal cross-section of a semiconductor device, according to one or more embodiments.

With reference to FIG. 4, FIG. 5 and FIGS. 6A to 6C, certain exemplary aspects of the surface region 11 of the semiconductor device 1 shall now be explained. FIG. 4 to FIG. 6C each schematically illustrate a section of horizontal cross-section of a semiconductor device 1 according to one or more embodiments, wherein FIG. 4 schematically illustrates aspects of a region A indicated in FIG. 5.

FIG. 4 schematically illustrates a section of a horizontal cross-section of an embodiment of the semiconductor device 1 and thus a top-view on the semiconductor device 1. Similarly to the embodiment shown in FIG. 3, the semiconductor device 1 comprises the first trench 14 which is neighbored by two third trenches 22. Next to the third trenches 22, there is arranged a respective second trench 21.

The control electrodes 211 included in the second trenches 21 may be electrically contacted by control electrode contact means 241, which may be realized by respective grooves. The control electrode contact means 241 can be electrically connected to each other by a control contact runner 244. The control contact runner 244 may form a part of a control contact structure 24 that may be contacted by a driver (not shown) for controlling the semiconductor device 1, e.g., by a gate driver that provides said control signal. For example, a control signal output of the driver may be electrically connected to the control contact structure 24 by means of a control contact pad 245 (illustrated in FIG. 5).

Figure 5:
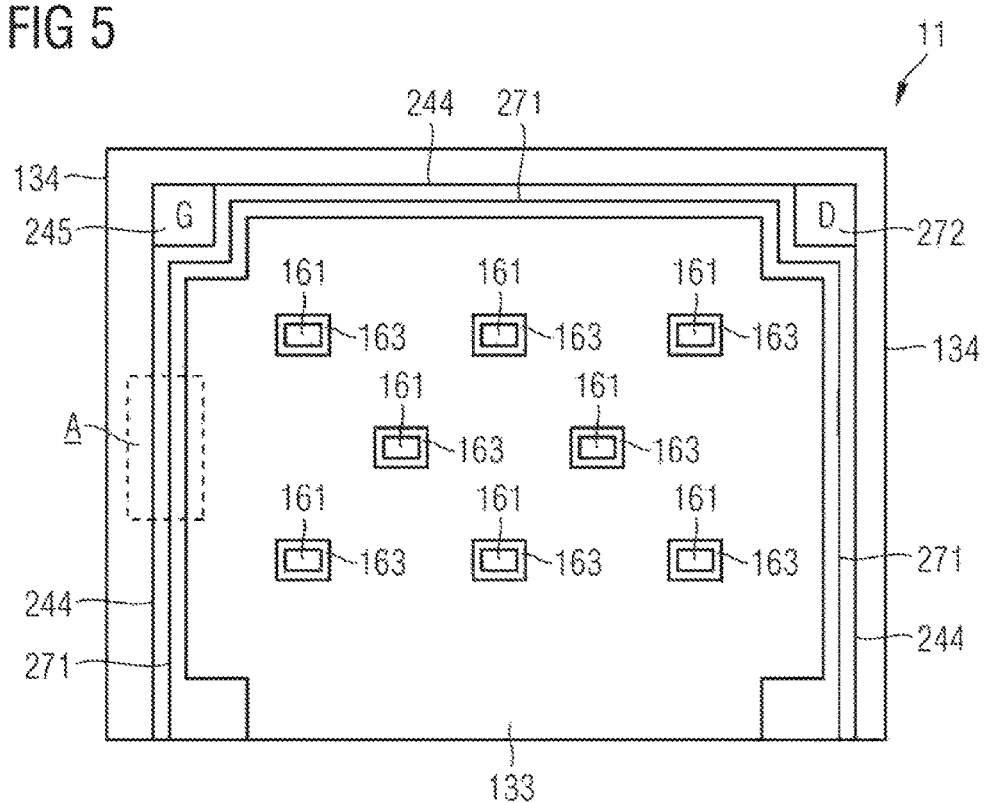
FIG. 5 schematically illustrates a section of a horizontal cross-section of a semiconductor device, according to one or more embodiments.

Similarly, the field electrodes 221 included in the third trenches 22 may be electrically contacted by field electrode contact means 137, which may be realized by respective grooves. The field electrode contact means 137 can be electrically connected to each other by a first load contact metal 133. For establishing electrical contact with the first load contact metal 133, a first load contact runner 134 may optionally be provided, as also illustrated in FIG. 5. FIG. 4 also schematically shows said first load contact grooves 132 that are in contact with the third semiconductor regions 123.

As explained above, the sensor electrode 141 included in the first trench 14 may be electrically connected to the first semiconductor regions 121 by means of said island 161 (not shown in FIG. 4, but indicated in FIGS. 3 and 5). The sensor electrode 141 included in the first trench may be electrically by contacted by sensor electrode contact means 274, which may be realized by a groove. The sensor contact structure 27 may include a sensor contact runner 271 that is in electrical contact with the electrode contact means 274. The sensor contact runner 271 exhibits substantially the same electrical potential as the electrical potential of the first semiconductor regions 121, since the first semiconductor regions 121 are electrically connected to the sensor electrode 141.

Regarding FIG. 5, it should be noted that even though the first load contact runner 134, the control contact runner 244 and the sensor contact runner 271 are each represented by a respective line, these runners may certainly exhibit a width greater zero, as indicated in FIG. 4. Between the first load contact runner 134 and the control contact runner 244, and between the control contact runner 244 and the sensor contact runner 271, and between the sensor contact runner 271 and the first load contact metal 133, there may be arranged an encapsulation oxide for electrically insulating the runners 134, 244, 271 and the first load contact metal 133 from each other.

For establishing an electrical contact between the first semiconductor regions 121 and the sensor electrode 141, there may be provided a plurality of said islands 161, as indicated in FIG. 5. Each island 161 may be electrically insulated from the first load contact metal 133 by means of a respective insulation structure 163. In addition, each island 161 may constitute a separate, spatially isolated and electrically conductive region.

Summarizing, in accordance with the embodiments illustrated in FIG. 4 and FIG. 5, the electrical potential of the first regions 121, i.e., the electrical potential of the electrically floating mesas between the first trench 14 and the neighboring third trenches 22, is electrically coupled into the sensor electrode 141. By means of the sensor electrode 141, the electrical potential is "transferred" to the sensor contact runner 271 of the sensor contact structure 27.

Figure 6A:
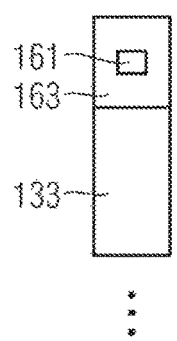
FIGS. 6A-6C schematically illustrate a section of horizontal cross-section of a semiconductor device, according to one or more embodiments.
Figure 6B:
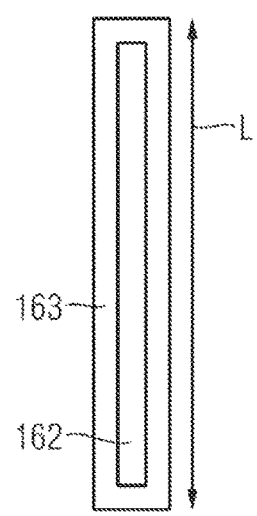
Figure 6C:
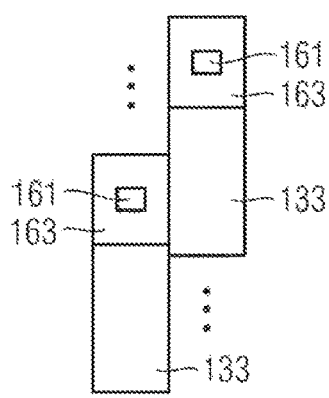

With regards to an exemplary way of positioning the plurality of islands 161, reference is made to FIGS. 6A to 6C. In accordance with the embodiment shown in FIG. 6A, the islands 161 may be distributed along the first trench 14, wherein the islands 161 are electrically insulated from the first load contact metal 133 by means of the respective insulation structure 163. The insulation structure 163 may form a part of the encapsulation 19, as illustrated in FIG. 3.

Alternatively or additionally, the islands 161 may be arranged in accordance with a pattern structure that is indicated in FIG. 6C and in FIG. 5.

Alternatively or additionally to several islands 161, the electrically conductive path 16 may comprise a stripe 162 also included in the surface region 11, as illustrated in FIG. 6B. The stripe 162 realizes the electrical connection between the first semiconductor regions 121 and the sensor electrode 141. For example, the stripe 162 is in electrical contact with the first semiconductor regions 121 along the entire chip length L indicated in FIG. 6B. The insulation structure 163 ensures that the stripe 162 is electrically insulated from the first load contact metal 133.

As illustrated in FIG. 5, the sensor contact structure 27 may further comprise a sensor contact pad 272. For example, this sensor contact pad 272 may be contacted by means of a bond wire (not shown) that is electrically coupled to said control circuit. Alternatively, the control circuit may be included within the sensor contact structure 27; thus, the semiconductor device 1 can monolithically integrate such control circuit. Alternatively, the control circuit may be mounted on the sensor contact structure 27. An exemplary embodiment of the control circuit will be explained with references to other figures.

The positions of the control contact pad 245 and the sensor contact pad 272 may be interchanged.

Figure 7:
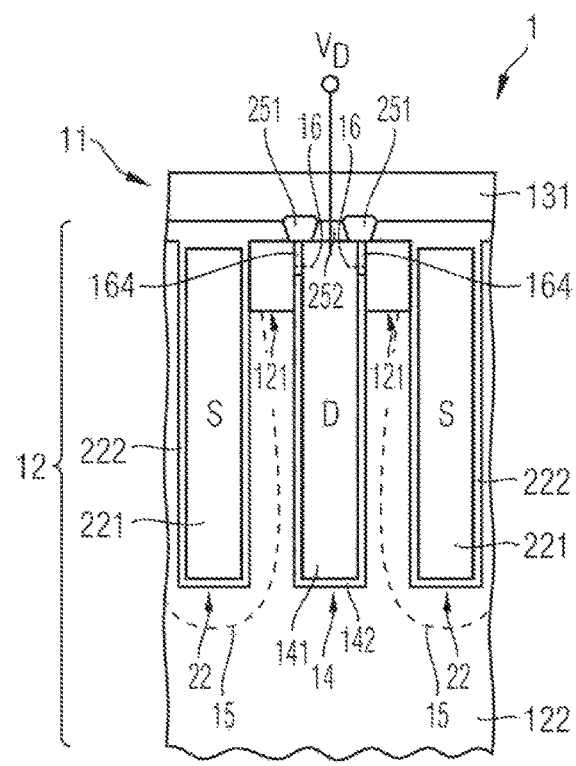
FIG. 7 schematically illustrates a section of a vertical cross-section of a semiconductor device, according to one or more embodiments.

FIG. 7 schematically illustrates a section of a cross-section of another embodiment of the semiconductor device 1. In this embodiment, the electrically conductive path 16 is realized by means of first plugs 164 that are enclosed within sidewalls of the first trench 14. In other words, the first plugs 164 interrupt the first dielectric 142 of the first trench 14 in order to realize the electrically conductive path 16 that electrically connects the sensor electrode 141 to the first regions 121. Further, first encapsulation means 251 and a second encapsulation means 252 included within the surface region 11 electrically insulate the sensor electrode 141 from the first load contact 131.

The third dielectric 222 of the third trenches 22 neighboring the first trench 14 electrically insulates the first semiconductor regions 121 from the field electrodes 221. In this embodiment, neither an island 161 nor a stripe 162 is needed for implementing the electrical contact between the sensor electrode 141 and the first semiconductor regions 121.

The electrical potential of the sensor electrode 141, which is referred to as $V_D$ in FIG. 7, can be received by the sensor contact structure 27 (not shown in FIG. 7).

Figure 8:
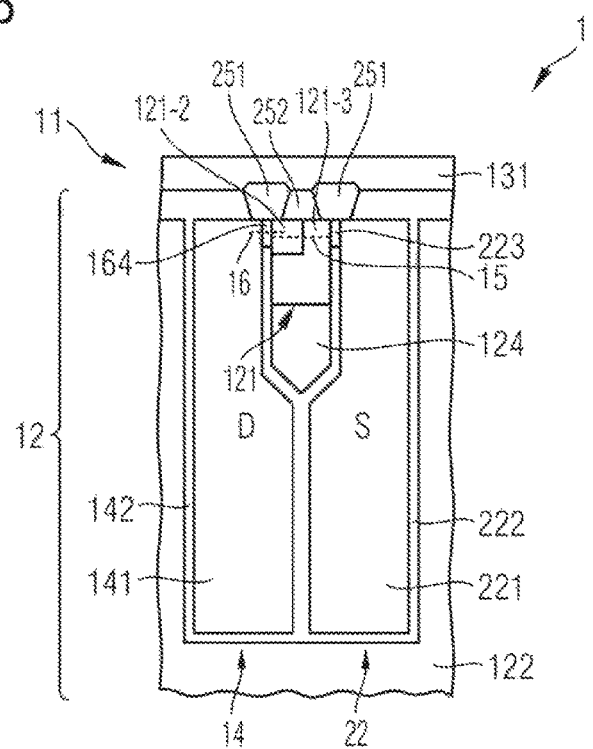
FIG. 8 schematically illustrates a section of a vertical cross-section of a semiconductor device, according to one or more embodiments.

FIG. 8 schematically illustrates a section of a cross-section of yet another embodiment of the semiconductor device 1. In this embodiment, the electrically conductive path 16 comprises the first plug 164 that is part of the first trench 14. The first plug 164 interrupts the first dielectric 142 of the first trench, such that the sensor electrode 141 is electrically connected to the first semiconductor region 121. Further, the first encapsulation means 251 and the second encapsulation means 252 included within the surface region 11 electrically insulate first semiconductor region 121 from the first load contact 131.

The first semiconductor region 121 is further electrically connected to the field electrode 221 of the third trench 22 by means of a field electrode plug 223 that is part of the third trench 22. In other words, the field electrode plug 223 interrupts the third dielectric 222 of the third trench such that the first semiconductor region 121 is electrically connected to the field electrode 221.

In accordance with the embodiment illustrated in FIG. 8, the first semiconductor region 121 comprises a first section 121-2 and a second section 121-3, wherein the second section 121-3 may comprise charge carriers of the first conductivity type and the first section 121-2 may comprise charge carriers of the second conductivity type. In this embodiment, the sensor electrode 141 is electrically coupled the first load contact structure 13 (not shown in FIG. 8) by means of the first semiconductor path 15 and the field electrode 221. The first semiconductor path 15 traverses through both first section 121-2 and the second section 121-3. As explained with regards to embodiments exemplary depicted in previous FIGS. 1 to 7, the field electrode 221 may be electrically connected to the first load contact structure 13.

A transition between the first section 121-2 and the second section 121-3 may thus form a second pn-junction. As indicated in FIG. 8, the first plug 164 is only in contact with the first section 121-2 and not in contact with the second section 121-3, and the field electrode plug 223 is only in contact with the second section 121-3 and not in contact with the first section 121-2.

The first semiconductor region 121 is further in contact with an insulated semiconductor region 124. The first dielectric 142 and the third dielectric 222 electrically insulate both the insulated semiconductor region 124 and the first semiconductor region 121 including the first section 121-2 and the second section 121-3 from the second semiconductor region 122. In other words, the first dielectric 142 and the third dielectric 222 separate both the insulated semiconductor region 124 and the first semiconductor region 121 including the first section 121-2 and the second section 121-3 from the second semiconductor region 122. Thus, the first semiconductor region 121 may be insulated from the second semiconductor region 122.

For example, by measuring both the electrical potential of the sensor electrode 141 and the electrical potential of the field electrode 221, a voltage-drop across the second pn-junction may be determined by a control circuit electrically coupled to the sensor electrode 141 and the field electrode 221. Since the voltage-drop across the second pn-junction depends on the temperature of the semiconductor body region 12, the temperature of the semiconductor body region 12 can be determined by employing the structure as schematically illustrated in FIG. 8.

For example, both the first section 121-2 and the second section 121-3 of the first semiconductor region 121 as well as the insulated semiconductor region 124 comprise a mono crystalline material. Further, the first section 121-2 of the first semiconductor region 121 may consist of the same material as the second semiconductor region 122 and the second section 121-3 of the first semiconductor 121 may consist of a material that is identical to the material of the third semiconductor regions 123 (not shown in FIG. 8) of the semiconductor body region 12. Thus, the voltage-drop across the second pn-junction is indicative of the temperature of such regions of the semiconductor body region 12 that conduct the load current.

Instead of forming the second pn-junction by means of the first section 121-2 and the second section 121-3, at least one of the first section 121-2 and the second section 121-3 may be designed such that it exhibits a specific resistance, e.g., by means of an impurity doping, such as by Selenium (Se) doping or by Sulfur (S) doping, or, alternatively, by means of forming the first section 121-2 and/or the second section 121-3 with a metallic material.

Figure 9:
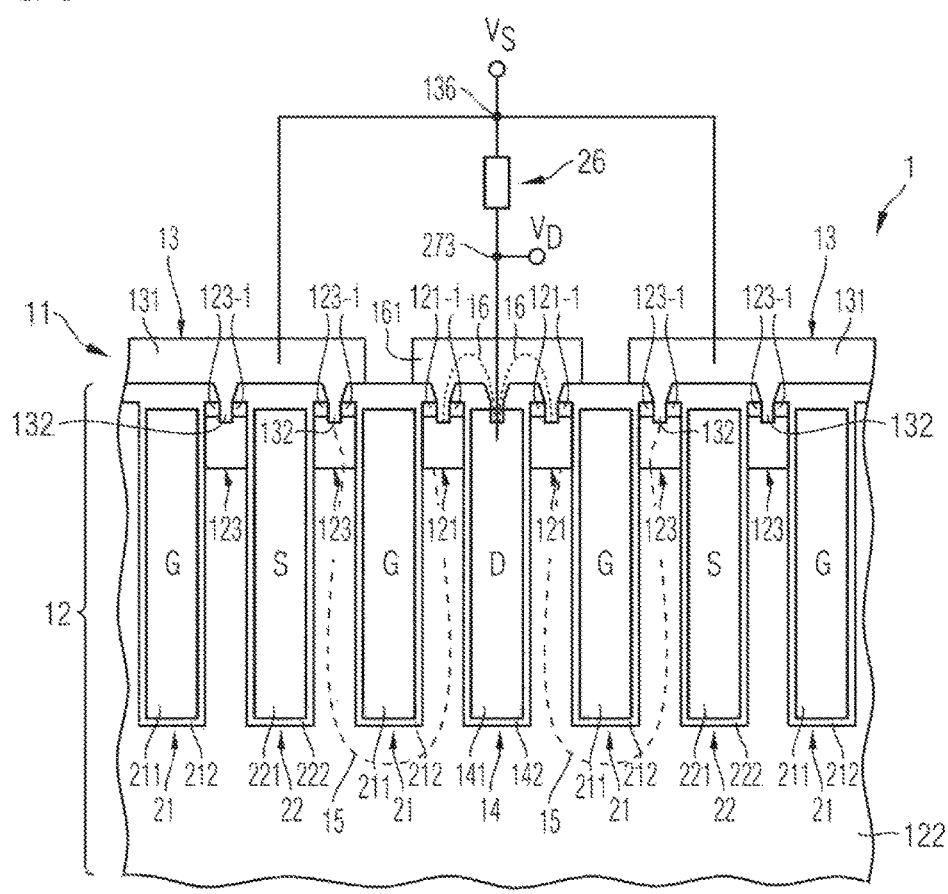
FIG. 9 schematically illustrates a section of a vertical cross-section of a semiconductor device, according to one or more embodiments.

FIG. 9 schematically illustrates a section of a vertical cross-section of yet another embodiment of the semiconductor device 1. The general set-up of the semiconductor device 1 shown in FIG. 9 essentially corresponds to the set-up already explained with respect to the embodiment illustrated in FIG. 3. Accordingly, the electrically conductive path 16 comprises said island 161 which electrically connects the sensor electrode 141 to the first semiconductor regions 121.

In the embodiment illustrated in FIG. 9, the first semiconductor regions 121 include contacting sections 121-1 in the upper part of the first semiconductor regions 121. For example, these contacting sections 121-1 are highly doped n-regions or highly doped p-regions of the first semiconductor regions 121. However, these contacting sections 121-1 are only optionally implemented. Also, the third semiconductor regions 123 include corresponding contacting sections 123-1 in their respective upper parts. Also these contacting sections 123-1 of the third semiconductor regions 123 can be highly doped n-regions. Therefore, when manufacturing the semiconductor device 1, both the first semiconductor regions 121 and the third semiconductor regions 123 can be produced within the same processing step. Also, the first trench 14 may exhibit the same spatial dimensions as the second trenches 21 and/or the third trenches 22. Therefore, when manufacturing the semiconductor device 1, both the first trench 14 and the second trenches 21 and/or the third trenches 22 can be produced within the same processing step.

In accordance with the embodiment of the semiconductor 1 shown in FIG. 9, a sensor resistor 26 electrically couples the first load contact structure 13 to the sensor electrode 141. At a first measurement point 273, which is schematically illustrated in FIG. 9, the electrical potential of the sensor electrode 141, which is substantially identical to the electrical potential of the first regions 121, and which is referred to as $V_D$ in FIG. 9, can be determined. At a second measurement point 136, the electrical potential of the first load contact structure 13, i.e., the electrical potential of the first load contacts 131, which is referred to as $V_S$ in FIG. 9, can be determined.

A voltage-drop $|V_D-V_S|$ between the first load contact structure 13 and the sensor electrode 141 depends on the load current and on a resistance of a sensor resistor 26. Thus, in knowledge of the resistance of the sensor resistor 26 and having said voltage-drop $|V_D-V_S|$ determined, the load current flowing through the semiconductor body region 12 can be determined. In contrast to the schematic illustration shown in FIG. 9, the sensor resistor 26 may also be monolithically integrated by means of available trenches that are not used for other purposes (not shown in FIG. 9). Additionally or alternatively, the sensor resistor 26 can be arranged externally of the semiconductor body region 12, e.g., between the sensor contact pad 272 and the first load contact metal 133 as schematically depicted in FIG. 5.

Figure 10:
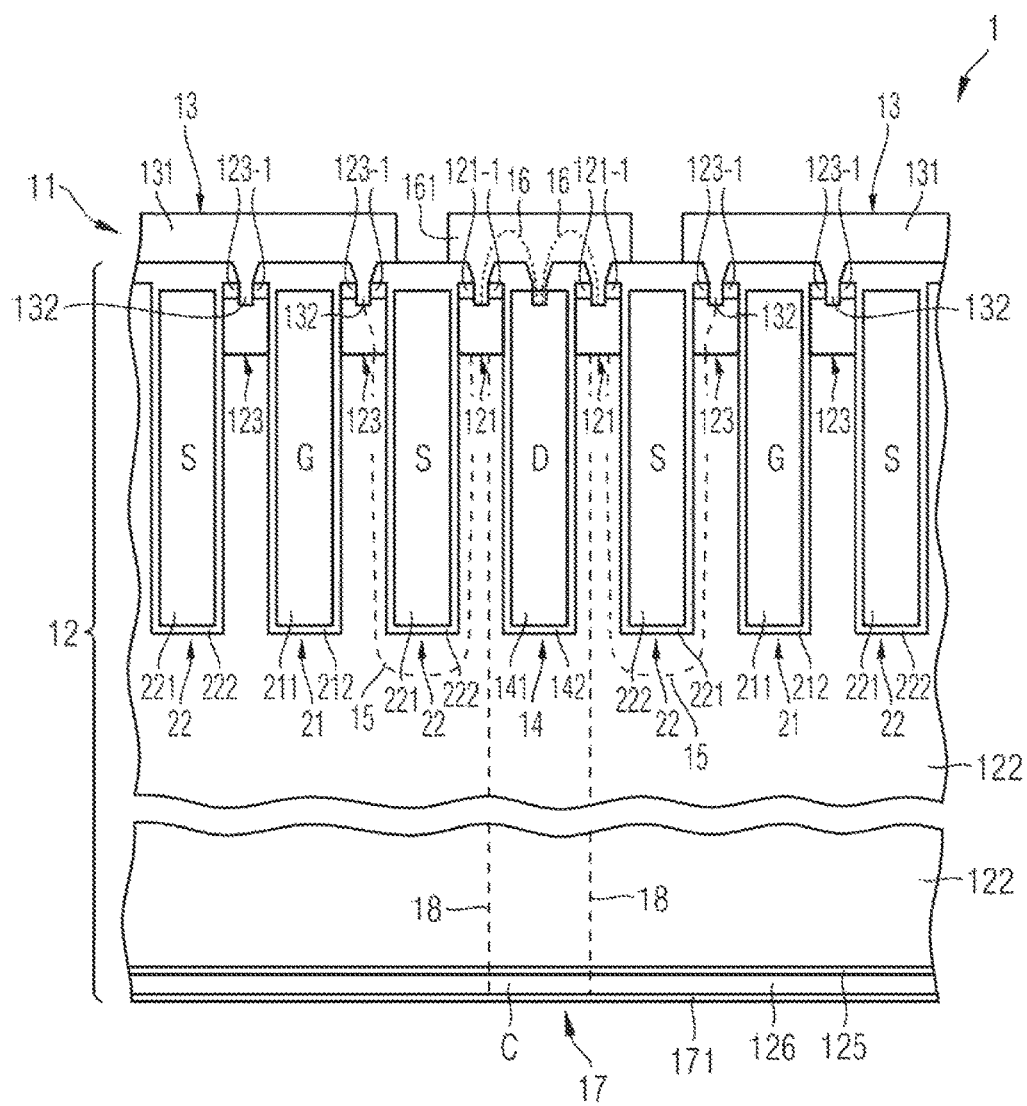
FIG. 10 schematically illustrates a section of a vertical cross-section of a semiconductor component, according to one or more embodiments.

FIG. 10 schematically illustrates a section of a vertical cross-section of an embodiment of a semiconductor component 6. The upper part of the semiconductor component 6 exhibits a set-up that essentially corresponds to the set-up already explained with respect to FIG. 3 and FIG. 9. Additionally, the semiconductor body region 12 of the semiconductor component 6 comprises a field stop layer 125 and a collector layer 126 adjacent to the field stop layer 125. The semiconductor body region 12 is terminated by a second load contact layer 171, which can be part of a second load contact structure 17 already exemplary mentioned with respect to FIG. 2. The second load contact structure 17 is arranged for coupling the load current out of the semiconductor body region 12. For example, the collector layer 126 comprises charge carriers of the first conductivity type and the field stop layer 125 comprises charge carriers of the second conductivity type.

The structure of the semiconductor component 6 may be employed for constructing, e.g., an IGBT, e.g., a stripe cell configuration IGBT, a vertical MOSFET and the like.

The first semiconductor regions 121 of the semiconductor component 6 are electrically coupled to the first load contact structure 13 by means of at least said first semiconductor path 15. Further, first semiconductor regions 121 are electrically coupled to the second load contact structure 17 by means of at least the second semiconductor path 18. That is to say: the sensor electrode 141 is neither electrically insulated from the first load contact structure 13 nor from the second load contact structure 17.

Figure 11:
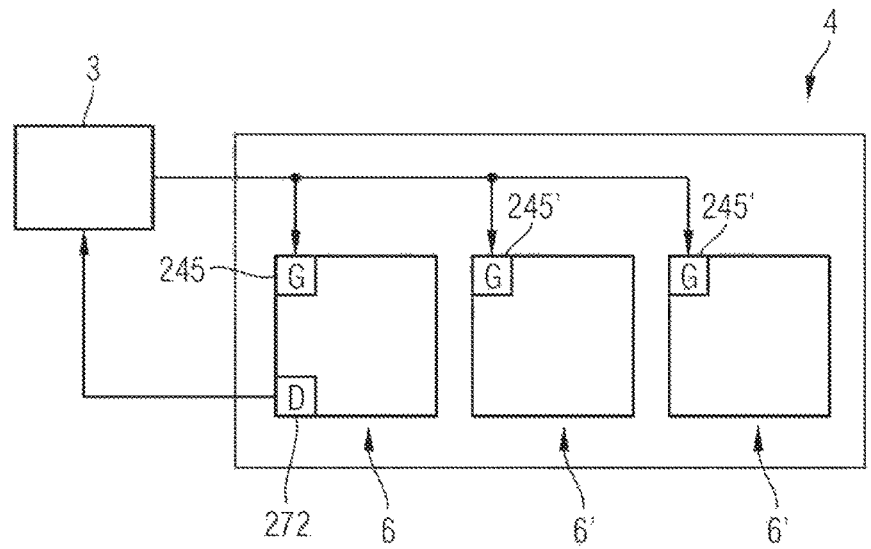
FIG. 11 schematically illustrates a parallel circuit of semiconductor components, according to one or more embodiments.

FIG. 11 schematically illustrates an embodiment of a parallel circuit 4 coupled to a control circuit 3. The control circuit 3 may be arranged for implementing a protective function. The parallel circuit 4 comprises a semiconductor component 6, for example in accordance with the embodiment as illustrated in FIG. 10, as well as further semiconductor components 6' connected in parallel to the semiconductor component 6. Each of the semiconductor components 6 and 6' are spatially isolated from each other. For example, the semiconductor components 6 and 6' may each comprise a separate housing.

The control circuit 3 is coupled to the control electrodes 211 of the second trenches 21 of the semiconductor component 6 in order to control operation of the semiconductor 6. For example, the control circuit 3 is electrically coupled to the control contact pad 245 already mentioned with reference to FIG. 5. Thus, the control circuit 3 may provide a control signal to the control electrodes 211 of the semiconductor component 6 via the control contact pad 245. The same control signal is also received by the further semiconductor components 6'. Each of these further semiconductor components 6' may also comprise a corresponding control contact pad 245' that is electrically connected to corresponding control electrodes included within the respective further semiconductor components 6'. For example, the control circuit 3 may be configured for turning off the semiconductor component 6 and the further semiconductor components 6', if a temperature of the semiconductor component 6 exceeds a predetermined threshold value and/or if the load current conducted by the semiconductor component 6 exceeds a predetermined threshold value.

The further semiconductor components 6' may exhibit a similar set-up as the semiconductor component 6 illustrated in FIG. 10. However, the further semiconductor components 6' must not necessarily comprise a respective sensor electrode included in a first trench that is electrically connected by an electrically conductive path to first semiconductor regions. For example, the first semiconductor components 6' respectively comprise, instead of the first trench 14, a respective further second trench 21 that includes a further control electrode 211. Instead of the island 161, there may be provided a further first load contact 131 that is in electrical contact with further third semiconductor regions 123 instead of the two first semiconductor regions 121 shown in FIG. 10. Accordingly, the further semiconductor components 6' do also not necessarily comprise said sensor contact structure 27. In another embodiment, the further semiconductor components 6' do also comprise a respective sensor electrode included in a first trench that is electrically connected by an electrically conductive path to first semiconductor regions, that is to say: In said other embodiment, the further semiconductor components 6' exhibit a structure that is substantially identical to the structure of the semiconductor component 6.

In the embodiment of the parallel circuit 4 illustrated in FIG. 11, however, only one component, namely the semiconductor component 6, exhibits a structure as exemplary illustrated in FIG. 10 and a corresponding sensor contact structure 27 that comprises the sensor contact 272. The sensor contact pad 272 is electrically coupled to the control circuit 3. Therefore, the control circuit 3 may determine the electrical potential of the sensor electrode 141 and may, therefore, determine the temperature and/or the load current of the semiconductor component 6. For example, if the temperature exceeds a predetermined threshold value and/or the load current exceeds a predetermined threshold value, the control circuit 3 may cause turn-off of both the semiconductor component 6 and the further semiconductor component 6' by providing a corresponding control signal to the control contact pad 245 and the further control contact pads 245'.

In other words, for protecting the semiconductor component 6 and the further semiconductor components 6' of the parallel circuit 4, it is only necessary that one of the components 6 and 6' exhibits a structure as shown in FIG. 10. The further semiconductor components 6' do not need to comprise said sensor contact structure 27 nor said first trench 14 including the sensor electrode 141, nor corresponding first and second semiconductor paths 15 and 18, nor said electrically conductive path 16. It shall be noted that, even though FIG. 10 illustrates that the electrically conductive path 16 comprises said island 161, the electrically conductive path 16 could also be formed by means of the first plugs 164 that have been explained with respect to FIG. 7 and FIG. 8. FIG. 11 rather schematically illustrates the general idea that within the parallel circuit 4 of semiconductor components 6 and 6', only one of these semiconductor components 6 and 6' needs to exhibit a structure as exemplarily explained with respect to the foregoing figures in order to be capable of providing the protective function based on the electrical potential of an active region of the semiconductor body region 12 of one of the semiconductor components 6 to 6'.

Figure 12:
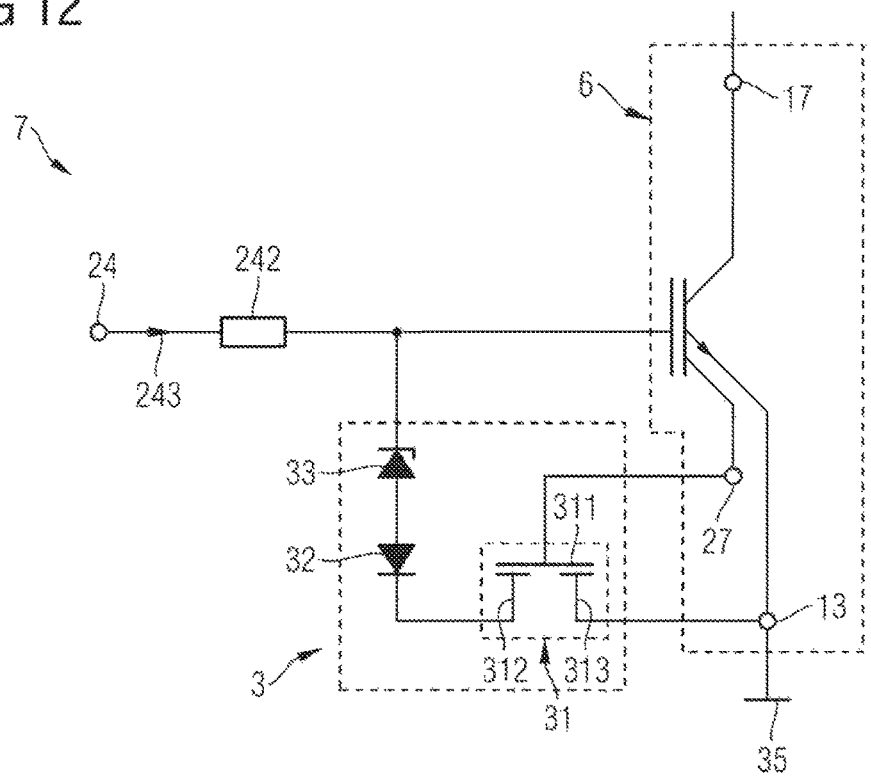
FIG. 12 schematically illustrates a semiconductor apparatus, according to one or more embodiments.

FIG. 12 schematically illustrates an embodiment of a semiconductor apparatus 7. The semiconductor apparatus 7 comprises a semiconductor component 6, for example the semiconductor component 6 as illustrated in FIG. 10.

A control signal 243 is provided to the control electrodes 211 by means of the control contact structure 24. The control contact structure 24 may exhibit a resistance 242. For example, the second load contact structure 17 is coupled to an electrical load (not shown in FIG. 12), such as an inductance. The first load contact structure 13 is coupled to ground 35. The sensor contact structure 27 provides the electrical potential of the sensor electrode 141 to the control circuit 3.

Specifically, the control circuit 3 comprises a control transistor 31, e.g., a MOS transistor, and the electrical potential of the sensor electrode 141 is provided to a control input 311 of the control transistor 31. A load output 313 of the control transistor 31 is coupled to ground 35. A load input 312 of the control transistor 31 may be electrically coupled to the control contact structure 24 by means of a control diode 32 and a control Zener diode 33 (also referred to as Z-diode). Thus, operation of the control transistor 31 is directly controlled by the electrical potential of the sensor electrode 141, which is substantially identical to the electrical potential of the first semiconductor region(s) 121. Since the control circuit 3 is further electrically coupled to the control electrodes 211, the control circuit 3 may control operation of the semiconductor component 6 in dependence of the electrical potential of the sensor electrode 141.

Regarding further optional aspects of the operation of the control circuit 3, reference is made to DE 101 23 818 B4, the content of said publication is incorporated herein by reference in its entirety.

The control circuit 3 may be monolithically integrated into the semiconductor component 6. Alternatively, the control circuit 3 may be arranged externally of the semiconductor component 6, i.e., not on a semiconductor substrate of the semiconductor component 6. Still, the control circuit 3 and the semiconductor component 6 can be included within the same housing (not shown).

In the above, some drawings showed that the first trench 14 is neighbored by two second trenches 21 or by two third trenches 22. However, in other embodiments, there may also be a further first trench instead of the second trench 21 or instead of the third trench 22 neighboring the first trench 14.

In the above, embodiments pertaining to semiconductor devices, semiconductor components and semiconductor apparatuses were explained. For example, these embodiments are based on silicon (Si). Accordingly, a monocrystalline semiconductor region or layer, e.g., the semiconductor regions 121, 121-2, 121-3, 122, 123, 123-1, 124 of exemplary embodiments, is typically a monocrystalline Si-region or Si-layer. In other embodiments, polycrystalline or amorphous silicon may be employed.

It should, however, be understood that the semiconductor body region 12 can be made of any semiconductor material suitable for manufacturing a semiconductor device/component/apparatus. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGainN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used.

Specifically, the encapsulation 19 may comprise or may consist of imide. Said islands 161 and said first load contacts 131 must not necessarily consist of the same material. For example, the first load contacts 131 may comprise or may consist of copper, wherein the islands 161 may comprise or may consist of a barrier material, such as titanium (Ti). The sensor electrode 141 may comprise or may consist of a polysilicon. The first plugs 164 and/or the field electrode plug 223 may comprise or may consist of a barrier material, such as titanium (Ti) and or tungsten (W).

Spatially relative terms such as "under," "below," "lower," "over," "upper" and the like, are used for ease of description to explain the positioning of one element relative to a second element. These terms are intended to encompass different orientations of the respective device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising a semiconductor body region and a surface region, the semiconductor body region including a first semiconductor region comprising charge carriers of a first conductivity type and including a second semiconductor region comprising charge carriers of a second conductivity type; the semiconductor device further comprising:
    a first load contact structure included in the surface region and arranged for feeding a load current into the semiconductor body region;
    a first trench extending into the semiconductor body region and comprising a sensor electrode and a first dielectric, the first dielectric electrically insulating the sensor electrode from the second semiconductor region;
    a second trench extending into the semiconductor body region and comprising a first control electrode and a second dielectric, the second dielectric electrically insulating the first control electrode from the second semiconductor region;
    a third trench extending into the semiconductor body region and comprising a second control electrode and a third dielectric, the third dielectric electrically insulating a second control electrode from the second semiconductor region;
    an electrically conductive path electrically connecting the sensor electrode to the first semiconductor region;
    a first semiconductor path, wherein the first semiconductor region is electrically coupled to the first load contact structure by means of at least the first semiconductor path;
    wherein
    the semiconductor device comprises a sensor contact structure included in the surface region and arranged for receiving an electrical potential of the sensor electrode;
    the first trench is arranged between the second trench and the third trench; and
    the first semiconductor region comprises an electrically floating region of the semiconductor body region.

2. The semiconductor device of claim 1, wherein the first semiconductor path is included within the semiconductor body region and comprises a first part and a second part, the first part of the first semiconductor path being arranged for conducting at least a part of the load current.

3. The semiconductor device of claim 2, wherein the first part of the first semiconductor path exhibits a voltage-drop that depends on the load current.

4. The semiconductor device of claim 2, wherein the second part of the first semiconductor path comprises a first pn-junction, wherein the first pn-junction is formed by a transition between the first semiconductor region and the second semiconductor region.

5. The semiconductor device of claim 1, further comprising a second load contact structure, the second load contact structure being arranged for coupling the load current out of the semiconductor body region.

6. The semiconductor device of claim 5, further comprising a second semiconductor path, wherein the first semiconductor region is electrically coupled to the second load contact structure by means of at least the second semiconductor path, wherein the second semiconductor path is included within the semiconductor body region.

7. The semiconductor device of claim 1, wherein the sensor contact structure is arranged to be electrically coupled to a control circuit.

8. The semiconductor device of claim 1, further comprising a sensor resistor, the sensor resistor electrically coupling the first load contact structure to the sensor electrode.

9. The semiconductor device of claim 1, wherein the electrically conductive path is included in the surface region and comprises at least one island, the at least one island electrically connecting the sensor electrode to the first semiconductor region, and wherein the first dielectric electrically insulates the sensor electrode from the first semiconductor region.

10. The semiconductor device of claim 1, wherein the electrically conductive path is included in the surface region and comprises at least one stripe, the at least one stripe electrically connecting the sensor electrode to the first semiconductor region, and wherein the first dielectric electrically insulates the sensor electrode from the first semiconductor region.

11. The semiconductor device of claim 9, further comprising an insulation structure, the insulation structure electrically insulating the at least one island from the first load contact structure.

12. A semiconductor device, comprising a semiconductor body region and a surface region, the semiconductor body region including a first semiconductor region comprising charge carriers of a first conductivity type and including a second semiconductor region comprising charge carriers of a second conductivity type; the semiconductor device further comprising:
- a first load contact structure included in the surface region and arranged for feeding a load current into the semiconductor body region;
- a first trench extending into the semiconductor body region and comprising a sensor electrode and a first dielectric, the first dielectric electrically insulating the sensor electrode from the second semiconductor region;
- a second trench extending into the semiconductor body region and comprising a first control electrode and a second dielectric, the second dielectric electrically insulating the first control electrode from the second semiconductor region;
- a third trench extending into the semiconductor body region and comprising a second control electrode and a third dielectric, the third dielectric electrically insulating a second control electrode from the second semiconductor region;
- an electrically conductive path electrically connecting the sensor electrode to the first semiconductor region;
- a first semiconductor path, wherein the sensor electrode is electrically coupled to the first load contact structure by means of at least the first semiconductor path;

wherein
the semiconductor device comprises a sensor contact structure included in the surface region and arranged for receiving an electrical potential of the sensor electrode;
the first trench is arranged between the second trench and the third trench; and
the first semiconductor region comprises an electrically floating region of the semiconductor body region.

13. The semiconductor device of claim 12, wherein the electrically conductive path comprises a first plug, the first plug being part of the first trench and electrically connecting the sensor electrode to the first semiconductor region.

14. The semiconductor device of claim 12, wherein the first semiconductor region comprises a first section and a second section, the first section comprising charge carriers of the second conductivity type and the second section comprising charge carriers of the first conductivity type, and wherein the first semiconductor path traverses through both first section and the second section.

15. The semiconductor device of claim 12, wherein the first semiconductor region is electrically insulated from the second semiconductor region.

16. A semiconductor apparatus having a semiconductor component that comprises a semiconductor body region and a surface region, the semiconductor body region including a first semiconductor region comprising charge carriers of a first conductivity type and including a second semiconductor region comprising charge carriers of a second conductivity type, the semiconductor component further comprising:
- a first load contact structure included in the surface region and arranged for feeding a load current into the semiconductor body region;
- a first trench extending into the semiconductor body region and comprising a sensor electrode and a first dielectric, the first dielectric electrically insulating the sensor electrode from the second semiconductor region;
- an electrically conductive path electrically connecting the sensor electrode to the first semiconductor region;
- a first semiconductor path, wherein the first semiconductor region is electrically coupled to the first load contact structure by means of at least the first semiconductor path;
- at least one second trench extending into the semiconductor body region, the at least one second trench comprising a control electrode and a second dielectric, wherein the control electrode is arranged for controlling the load current in dependence of a control signal, and wherein the second dielectric electrically insulates the control electrode from the semiconductor body region;
- at least one third trench extending into the semiconductor body region, the at least one third trench comprising a field electrode and a third dielectric, wherein the field electrode is electrically connected to the first load contact structure, and wherein the third dielectric electrically insulates the field electrode from the semiconductor body region;

wherein
the semiconductor component further comprises a sensor contact structure included in the surface region and arranged for receiving an electrical potential of the sensor electrode;
the first trench is arranged between the at least one second trench and the at least one third trench; and
the first semiconductor region comprises an electrically floating region of the semiconductor body region.

17. The semiconductor apparatus of claim 16, wherein the first trench is neighbored by two second trenches.

18. The semiconductor apparatus of claim 16, further comprising a second load contact structure and a second semiconductor path, the second load contact structure being arranged for coupling the load current out of the semiconductor body region, wherein the first semiconductor region is electrically coupled to the second load contact structure by means of at least the second semiconductor path.

19. The semiconductor apparatus of claim 16, further comprising a control circuit, wherein the control circuit is arranged to control the load current in dependence of the electrical potential of the sensor electrode.

20. The semiconductor device of claim 1, wherein the first trench comprises a pair of opposing sidewalls that vertically extend from an upper surface of the semiconductor body into the semiconductor body, and wherein the first dielectric lines both opposing sidewalls of the first trench.

* * * * *